(12) United States Patent
Shin

(10) Patent No.: US 10,575,415 B2
(45) Date of Patent: Feb. 25, 2020

(54) HINGED SUPPORT MEMBER AND FLEXIBLE DISPLAY DEVICE INCLUDING THE SAME

(71) Applicant: SAMSUNG DISPLAY CO., LTD., Yongin-si, Gyeonggi-do (KR)

(72) Inventor: Jaiku Shin, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/957,347

(22) Filed: Apr. 19, 2018

(65) Prior Publication Data

US 2019/0090364 A1    Mar. 21, 2019

(30) Foreign Application Priority Data

Sep. 18, 2017    (KR) .................. 10-2017-0119770

(51) Int. Cl.
*H05K 5/00* (2006.01)
*H05K 5/02* (2006.01)
*H01L 27/32* (2006.01)
*H01L 51/52* (2006.01)

(52) U.S. Cl.
CPC ......... *H05K 5/0017* (2013.01); *H01L 27/323* (2013.01); *H01L 51/524* (2013.01); *H05K 5/0226* (2013.01); *H01L 27/3276* (2013.01); *H01L 2251/5338* (2013.01)

(58) Field of Classification Search
CPC .. H05K 5/0017; H05K 5/0226; H01L 51/524; H01L 27/323; H01L 2251/5338
See application file for complete search history.

(56) References Cited

U.S. PATENT DOCUMENTS

| | | | |
|---|---|---|---|
| 9,173,287 | B1 | 10/2015 | Kim et al. |
| 9,348,370 | B2 | 5/2016 | Song |
| 9,786,207 | B2 | 10/2017 | Kim et al. |
| 9,798,359 | B2 | 10/2017 | Seo et al. |
| 10,082,839 | B1 * | 9/2018 | Turchin ............... G06F 1/1641 |
| 10,143,098 | B1 * | 11/2018 | Lee ....................... G06F 1/1652 |

(Continued)

FOREIGN PATENT DOCUMENTS

| KR | 10154764 | 8/2015 |
|---|---|---|
| KR | 101547640 | 8/2015 |

(Continued)

*Primary Examiner* — Binh B Tran
*Assistant Examiner* — Douglas R Burtner
(74) *Attorney, Agent, or Firm* — F. Chau & Associates, LLC

(57) ABSTRACT

A display device includes first and second support members arranged along a first direction, a joint part therebetween, a hinge member adjacent to facing sides of the first and second support members that extends in a second direction crossing the first direction, and that includes two rotation axes, and a flexible display module on the first and second support members and the joint part. The joint part includes a first joint unit that extends in the second direction and a plurality of second joint units arranged in the first direction, where the first joint unit is interposed between the plurality of second joint units. The second joint units extend in the second direction, and each of the second joint units has recesses between side and top surfaces thereof and that extend in the second direction.

15 Claims, 16 Drawing Sheets

(56) References Cited

U.S. PATENT DOCUMENTS

| | | | |
|---|---|---|---|
| 10,244,641 B2 * | 3/2019 | Seo | G06F 1/1641 |
| 10,420,233 B2 * | 9/2019 | Lee | G06F 1/1643 |
| 2015/0131222 A1 * | 5/2015 | Kauhaniemi | G06F 1/1652 |
| | | | 361/679.27 |
| 2015/0241925 A1 * | 8/2015 | Seo | G06F 1/1652 |
| | | | 361/679.27 |
| 2015/0361696 A1 | 12/2015 | Tazbaz | |
| 2017/0061836 A1 * | 3/2017 | Kim | G09F 9/301 |
| 2017/0064844 A1 * | 3/2017 | Hsu | F16C 11/04 |
| 2017/0142847 A1 * | 5/2017 | Park | H05K 5/0017 |
| 2018/0020556 A1 * | 1/2018 | Seo | G06F 1/1641 |
| 2018/0092223 A1 * | 3/2018 | Hsu | G06F 1/1681 |
| 2018/0145269 A1 * | 5/2018 | Myeong | G06F 1/1652 |
| 2018/0242466 A1 * | 8/2018 | Lee | G09F 9/301 |
| 2019/0033920 A1 * | 1/2019 | Yun | G06F 1/1652 |
| 2019/0036068 A1 * | 1/2019 | Kim | H01L 51/5237 |
| 2019/0090363 A1 * | 3/2019 | Bi | E05D 3/06 |
| 2019/0261524 A1 * | 8/2019 | Choi | G06F 1/1616 |
| 2019/0274228 A1 * | 9/2019 | You | H05K 5/0217 |

FOREIGN PATENT DOCUMENTS

| | | |
|---|---|---|
| KR | 101563942 | 10/2015 |
| KR | 1020160035146 | 3/2016 |
| KR | 1020170026023 | 3/2017 |
| KR | 101727971 | 4/2017 |

\* cited by examiner

HINGED SUPPORT MEMBER AND FLEXIBLE DISPLAY DEVICE INCLUDING THE SAME

CROSS-REFERENCE TO RELATED APPLICATIONS

This U.S. non-provisional patent application claims priority under 35 U.S.C. § 119 from, and the benefit of, Korean Patent Application No. 10-2017-0119770, filed on Sep. 18, 2017 in the Korean Intellectual Property Office, the contents of which are herein incorporated by reference in their entirety.

BACKGROUND

Embodiments of the present disclosure are directed to a display device, and in particular, to a foldable display device.

Electronic products, such as a smart phone, a digital camera, a notebook computer, a navigation system, or a smart television, have an image display device that displays an image to a user. The image display device can generate an image and provide the image to a user through a screen.

Various display devices have been developed recently. A typical example of such a display device is a flexible display device that can be deformed, folded, or rolled. Since a shape of the flexible display device can be variously changed, the use of the flexible display device allows for improved portability and user convenience.

SUMMARY

Some embodiments of the inventive concept provide a support member, which is configured to prevent a folding region of a display panel from being deformed, and a display device including the same.

According to some embodiments of the inventive concept, a display device includes a first support member and a second support member arranged along a first direction, a joint part disposed between the first and second support members, a hinge member adjacent to facing sides of the first and second support members and that extends in a second direction crossing the first direction, wherein the hinge member is connected to a bottom surface of the joint part and bottom surfaces of the first and second support members and includes two rotation axes, and a flexible display module disposed on the first and second support members and the joint part. The joint part includes a first joint unit that extends in the second direction and a plurality of second joint units arranged in the first direction and that extend in the second direction. The first joint unit is disposed between the plurality of second joint units, and each of the second joint units includes recesses between the side and top surfaces thereof and that extend in the second direction.

According to some embodiments of the inventive concept, a support member includes a first support member and a second support member arranged along a first direction, and a joint part disposed between the first and second support members. The joint part includes a first joint unit that extends in a second direction that crosses the first direction, and a plurality of second joint units arranged along the first direction and that extends in the second direction with the first joint unit interposed therebetween. Each of the second joint units includes a first portion that extends in the second direction and that has a reverse trapezoidal shape when viewed from the second direction and a second portion that extends upward from a top surface of the first portion and that has a rectangular shape. A width of the second portion is less than a width of the top surface of the first portion, when measured in the first direction.

According to some embodiments of the inventive concept, a support member includes a first support member and a second support member arranged along a first direction; a joint part disposed between the first and second support members; and a hinge member adjacent to facing sides of the first and second support members and that extends in a second direction crossing the first direction, wherein the hinge member is connected to a bottom surface of the joint part and bottom surfaces of the first and second support members and includes two rotation axes. The joint part includes a first joint unit; a plurality of second joint units disposed between the first joint unit and the first support member; and a plurality of third joint units disposed between the first joint unit and the second support member. The first, second, and third joint units are arranged in the first direction and extend in the second direction, the third joint units are symmetric with respect to the second joint units, and each of the second joint units has a trapezoidal shape. Each of the second joint units includes a top surface parallel to the first and second directions; a bottom surface that faces and is parallel to the top surface; and side surfaces that connect sides of the top surface to sides of the bottom surface and that are asymmetric with respect to each other.

Figure 1:
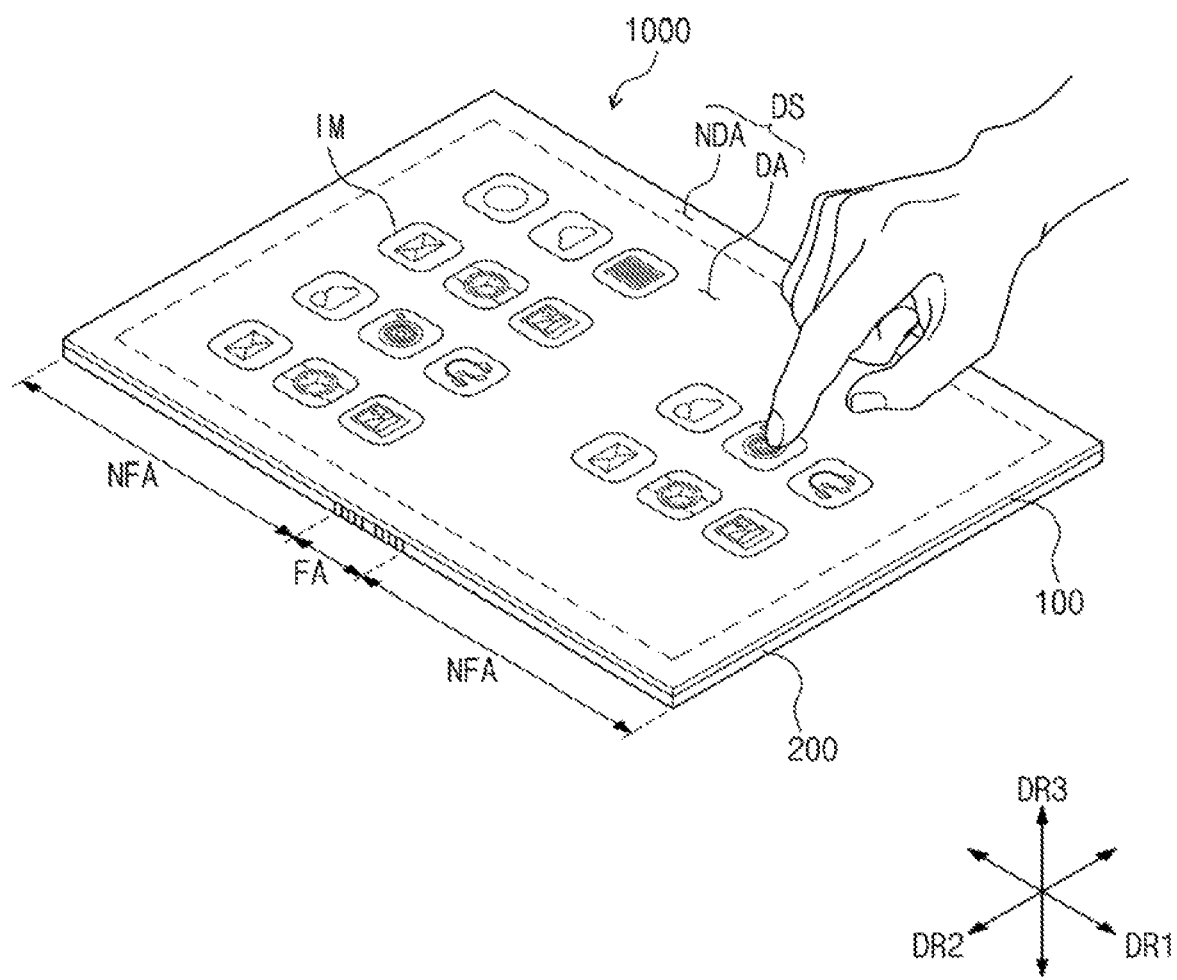
FIG. 1 is a perspective view that illustrates a display device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments.

DETAILED DESCRIPTION

Exemplary embodiments of the inventive concepts will now be described more fully with reference to the accompanying drawings, in which exemplary embodiments are shown. Exemplary embodiments of the inventive concepts may, however, be embodied in many different forms and should not be construed as being limited to the embodiments set forth herein. In the drawings, the thicknesses of layers and regions may be exaggerated for clarity. Like reference numerals in the drawings may denote like elements, and thus their description will be omitted.

It will be understood that when an element is referred to as being "connected" or "coupled" to another element, it can be directly connected or coupled to the other element or intervening elements may be present.

Figure 2:
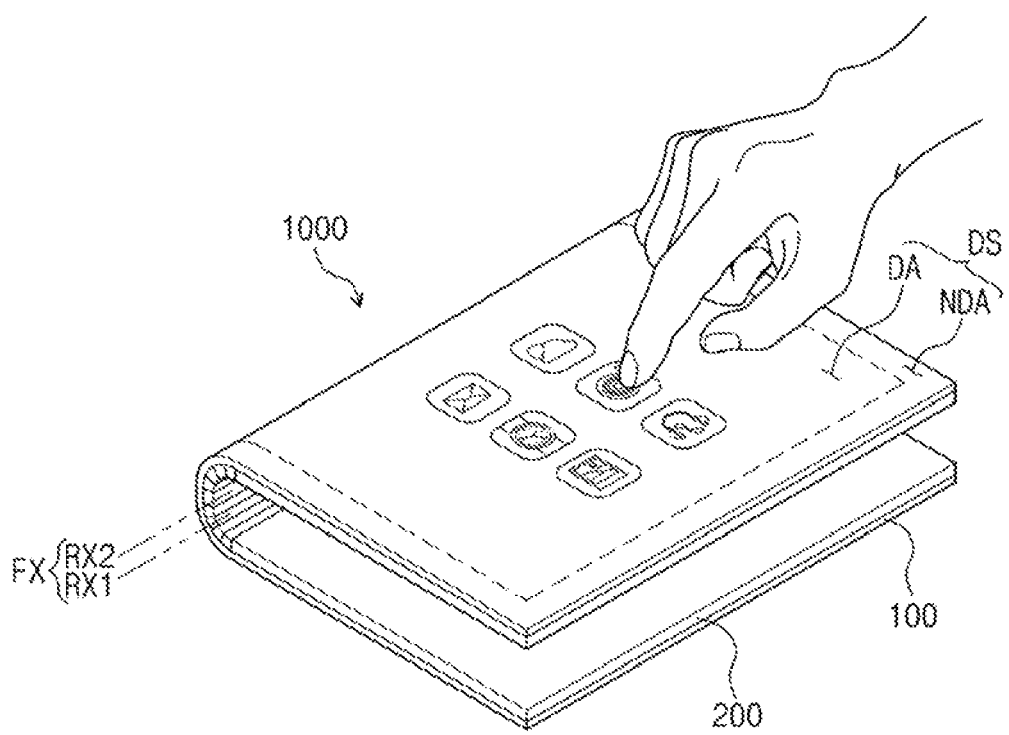
FIG. 2 illustrates a display device of FIG. 1 in an out-folded state.
Figure 3:
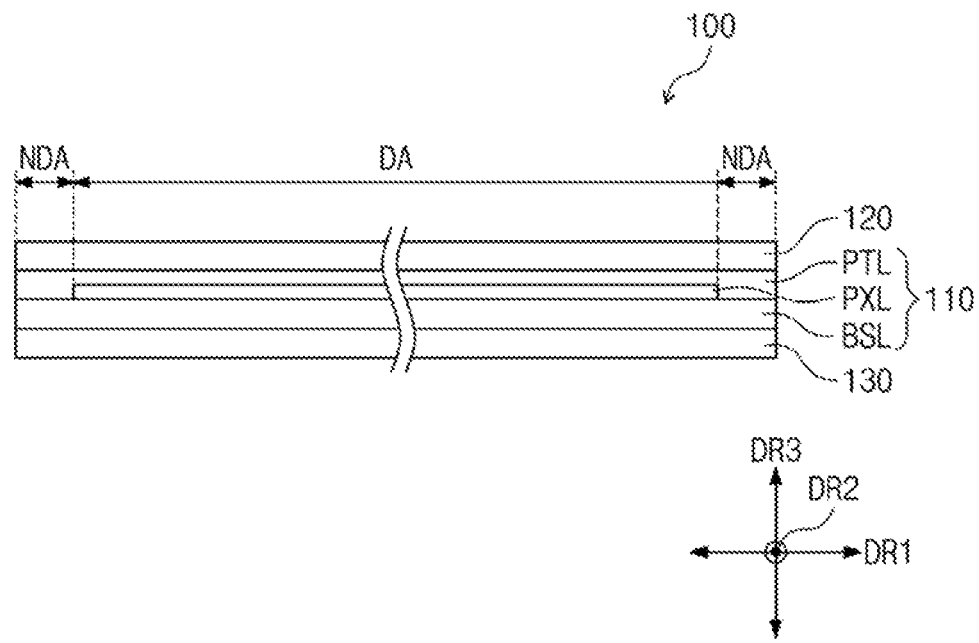
FIG. 3 is a sectional view of a display module of FIG. 1.

FIG. 1 is a perspective view that illustrates a display device according to some embodiments of the inventive concept. FIG. 2 illustrates a display device of FIG. 1 in an out-folded state. FIG. 3 is a sectional view of a display module of FIG. 1.

According to some embodiments, referring to FIGS. 1, 2 and 3, a display device 1000 has a rectangular prism shape, whose long sides are parallel to a first direction DR1 and whose short sides are parallel to a second direction DR2 that crosses the first direction DR1. However, embodiments of the inventive concept are not limited thereto, and the display device 1000 may have various other shapes. The display device 1000 is a flexible display device, such as a foldable display device that can be folded or unfolded with respect to a folding axis FX that extending in the second direction DR2.

According to some embodiments, the display device 1000 can be divided into a plurality of regions, according to its folding state. For example, the display device 1000 can be divided into a folding region FA, which can be folded, and two non-folding regions NFA, which maintain a flat shape. The non-folding regions NFA are arranged along the first direction DR1, and the folding region FA is positioned between the two non-folding regions NFA. In a present embodiment, the display device 1000 is illustrated as having only one folding region, but embodiments of the inventive concept are not limited thereto. For example, the display device 1000 may have a plurality of folding regions.

According to some embodiments, the folding axis FX includes a first rotation axis RX1 and a second rotation axis RX2 about which the display device 1000 rotates and which extend parallel to the second direction DR2 adjacent to each other. The folding region FA overlaps the first and second rotation axes RX1 and RX2, and the display device 1000 can be folded along the first and second rotation axes RX1 and RX2.

According to some embodiments, the display device 1000 includes a flexible display module 100 and a support member 200 provided below the display module 100. A top surface of the display module 100 can be referred to as a display surface DS and is parallel to a plane defined by the first and second directions DR1 and DR2. The display surface DS is used to display images IM, which are generated by the display module 100, to a user.

According to some embodiments, the display surface DS includes a display region DA and a non-display region NDA near or around the display region DA. The display region DA can display an image, and the non-display region NDA does not display an image. The non-display region NDA encloses the display region DA, thereby serving as an edge portion, in particular, having a specific color, of the display device 1000.

Referring to FIG. 3, according to some embodiments, the display module 100 includes a display panel 110, a touch-sensing unit 120 disposed on the display panel 110, and a protection film 130 disposed below the display panel 110. The display panel 110 is flexible and can generate an image to be provided to a user. The display panel 110 may be one of a liquid crystal display panel, an organic light emitting display panel, an electrophoresis display panel, an electrowetting display panel, or various other display panels that can display an image thereon. The protection film 130 is formed of or includes at least one flexible plastic material.

According to some embodiments, the touch-sensing unit 120 can sense an external input, such as a user's hand, a touch pen, etc., to generate an input signal from the sensed external input, and to provide the input signal to the display panel 110. The touch-sensing unit 120 includes a plurality of touch sensor units that can sense the external input. The touch sensor units can capacitatively sense an external input. The display panel 110 can receive an input signal from the touch-sensing unit 120 and generate an image on the basis of the input signal.

According to some embodiments, the protection film 130 is attached to a bottom surface of the display panel 110 to protect the bottom surface of the display panel 110. In addition, a window for protecting the touch-sensing unit 120 can be disposed on the touch-sensing unit 120.

According to some embodiments, the support member 200 supports the display module 100, and the support member 200 can rotate about the first and second rotation axes RX1 and RX2, when it is folded or unfolded. If the support member 200 is folded, the flexible display module 100 is also folded by the support member 200. In some embodiments, the display device 1000 can be folded out by the support member 200 to externally expose the display surface DS of the display module 100.

A detailed structure of the support member 200 will be described in detail with reference to FIGS. 5 to 8. Hereinafter, a direction which is not parallel to the first and second directions DR1 and DR2 will be referred to as a third direction DR3. The third direction DR3 include an upward direction and a downward direction opposite to the upward direction.

According to some embodiments, the display panel 110 includes a base layer BSL, a pixel layer PXL disposed on the base layer BSL, and a protection layer PTL disposed on the base layer BSL that covers the pixel layer PXL.

According to some embodiments, the base layer BSL defines a rear surface of the display module 100 and is flexible. The protection film 130 is disposed below the base layer BSL. The pixel layer PXL includes a plurality of pixels and can generate the images IM in response to electrical signals applied thereto. The protection layer PTL can protect the pixel layer PXL, and the touch-sensing unit 120 is disposed on the protection layer PTL. The protection layer PTL has a multi-layered structure and includes at least one organic insulating layer or at least one inorganic insulating layer.

Figure 4:
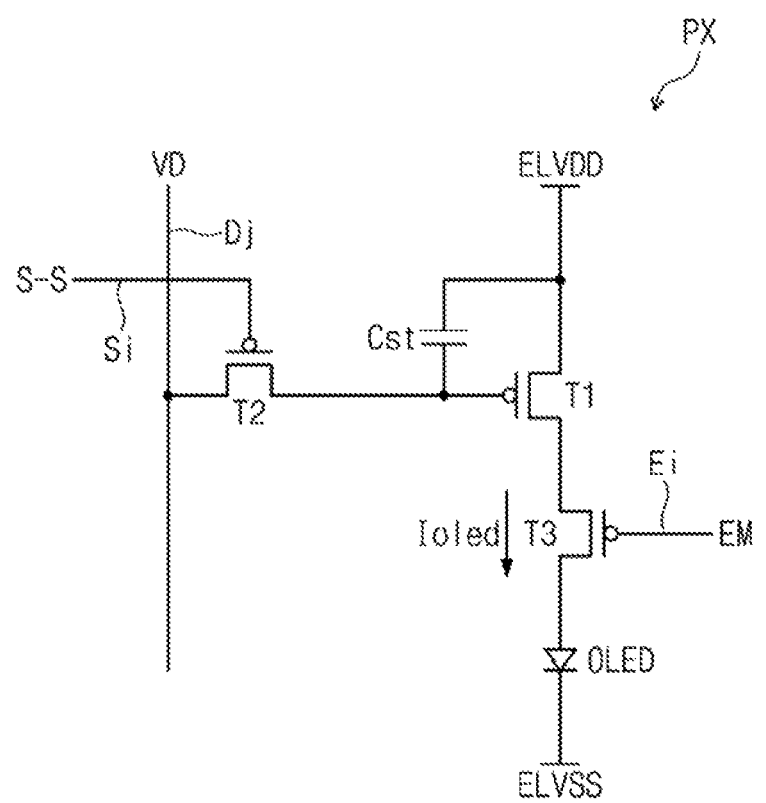
FIG. 4 is an equivalent circuit diagram of a pixel in a pixel layer of FIG. 3.

FIG. 4 is an equivalent circuit diagram of a pixel in a pixel layer of FIG. 3.

In FIG. 4, a structure of one exemplary pixel PX is illustrated, but other pixels have the same structure as the pixel PX shown in FIG. 4. In some embodiments, the pixel PX of FIG. 4 is an organic light emitting device that is used in an organic light emitting display panel.

According to some embodiments, referring to FIG. 4, the pixel PX is connected to a scan line Si, a data line Dj, and a light-emitting line Ei, where i and j are natural numbers. The pixel PX includes a light-emitting device OLED, a driving transistor T1, a capacitor Cst, a switching transistor T2, and a light-emitting control transistor T3. The light-emitting device OLED is an organic light emitting diode.

According to some embodiments, a source terminal of the driving transistor T1 is applied with a first voltage ELVDD, and a drain terminal of the driving transistor T1 is connected to a source terminal of the light-emitting control transistor T3. A gate terminal of the driving transistor T1 is connected to a drain terminal of the switching transistor T2.

According to some embodiments, a gate terminal of the switching transistor T2 is connected to the scan line Si, and a source terminal of the switching transistor T2 is connected to the data line Dj. A first electrode of the capacitor Cst is connected to the source terminal of the driving transistor T1, and a second electrode of the capacitor Cst is connected to the gate terminal of the driving transistor T1.

According to some embodiments, a gate terminal of the light-emitting control transistor T3 is connected to the light-emitting line Ei, and a drain terminal of the light-emitting control transistor T3 is connected to an anode electrode of the light-emitting device OLED. A cathode electrode of the light-emitting device OLED is applied with a second voltage ELVSS. The second voltage ELVSS has a voltage level lower than that of the first voltage ELVDD.

According to some embodiments, the switching transistor T2 is turned on in response to a scan signal S-S transmitted through the scan line Si. If the switching transistor T2 is turned on, a data voltage VD applied to the data line Dj is transmitted to the gate terminal of the driving transistor T1 through the switching transistor T2. The capacitor Cst is charged to the data voltage VD applied to the gate terminal of the driving transistor T1 and is maintained at the data voltage VD, even after the switching transistor T2 is turned off.

According to some embodiments, if a light-emitting signal EM is applied to the gate terminal of the light-emitting control transistor T3 through the light-emitting line Ei, the light-emitting control transistor T3 is turned on in response to the light-emitting signal EM. In this case, a current Ioled is supplied to the organic light emitting diode OLED from the driving transistor T1 through the light-emitting control transistor T3. The pixel PX can emit light during an applying period of the light-emitting signal EM, and an intensity of light emitted from the light-emitting device OLED can change depending on an strength of the current Ioled.

According to some embodiments, the transistors T1-T3 of the pixel PX are PMOS transistors, but embodiments of the inventive concept are not limited thereto. For example, the transistors T1-T3 of the pixel PX may be NMOS transistors.

Figure 5:
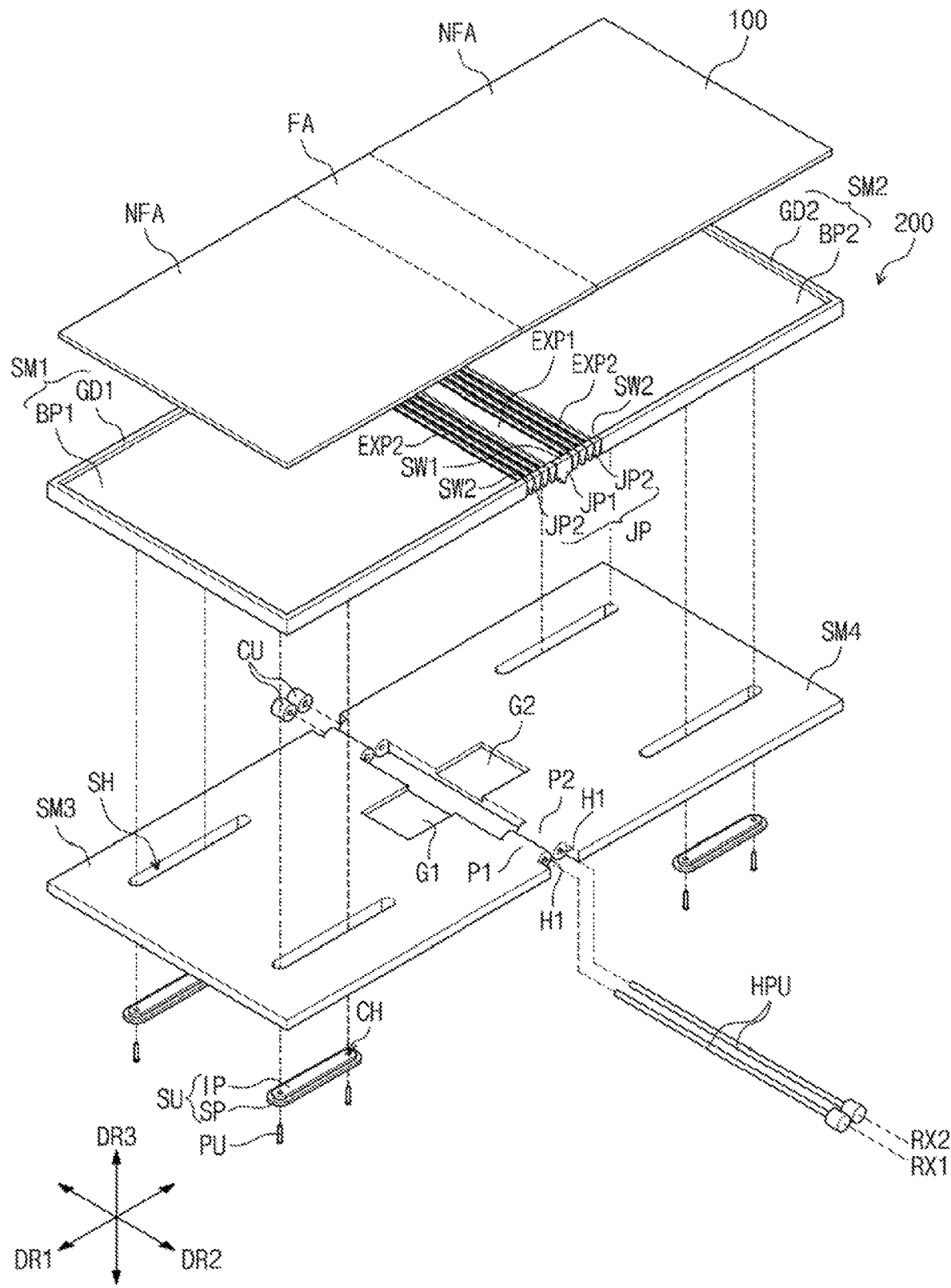
FIG. 5 is an exploded top perspective view of a support member of FIG. 1.
Figure 6:
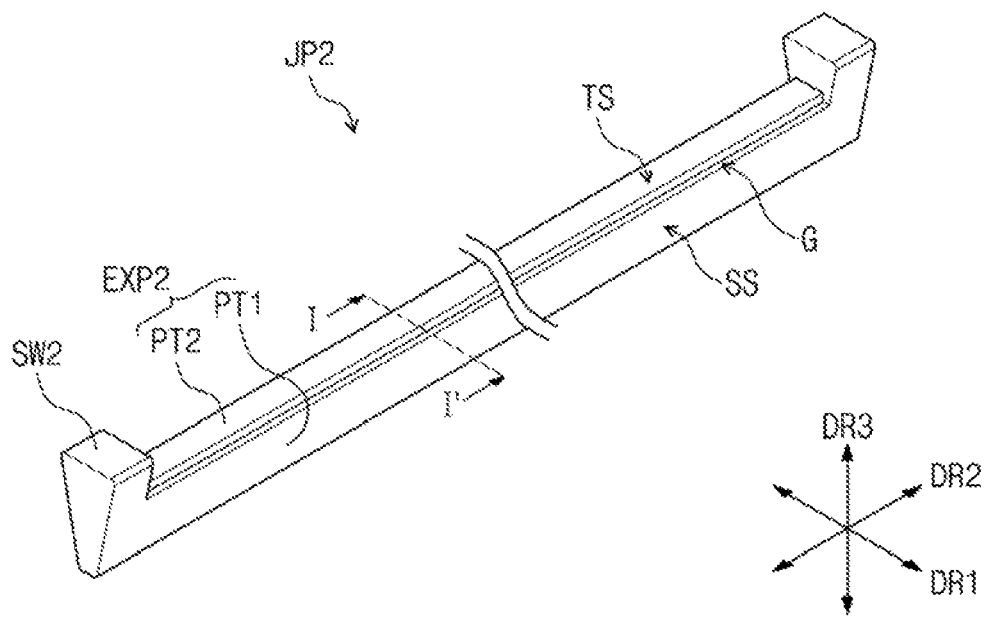
FIG. 6 is an enlarged perspective view of a second joint unit shown in FIG. 5.
Figure 7:
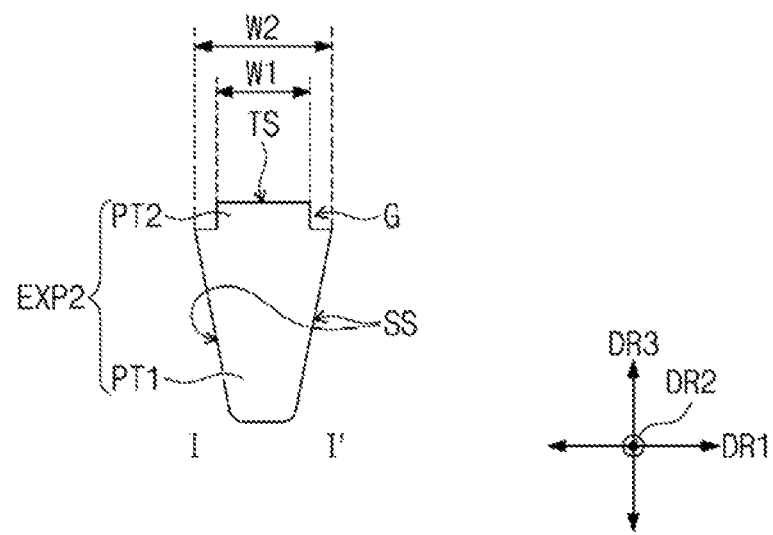
FIG. 7 is a sectional view taken along line I-I' of FIG. 6.
Figure 8:
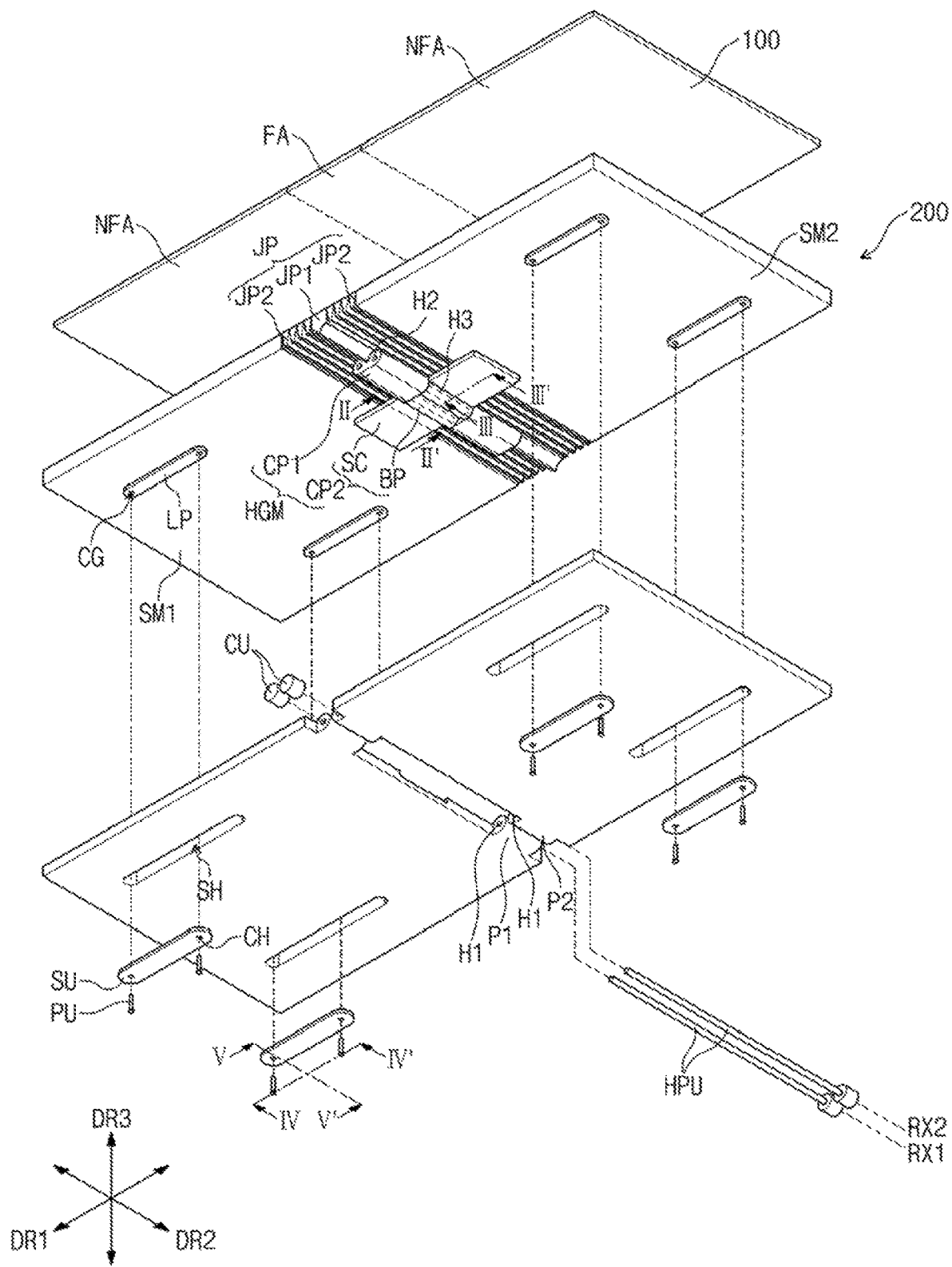
FIG. 8 is an exploded bottom perspective view of a support member of FIG. 1.

FIG. 5 is an exploded top perspective view of the support member of FIG. 1. FIG. 6 is an enlarged perspective view of a second joint unit shown in FIG. 5. FIG. 7 is a sectional view taken along line I-I' of FIG. 6. FIG. 8 is an exploded bottom perspective view of a support member of FIG. 1.

According to some embodiments, referring to FIGS. 5 and 8, the support member 200 includes a first support member SM1, a second support member SM2, a third support member SM3, a fourth support member SM4, a joint part JP, a hinge member HGM, a plurality of sliding units SU, a pair of hinge pin units HPU, and a pair of coupling units CU.

According to some embodiments, the first and second support members SM1 and SM2 are arranged along the first direction DR1 and in a plane that is parallel to the first and second directions DR1 and DR2. The joint part JP extends in the second direction DR2 and is positioned between the first and second support members SM1 and SM2. The display module 100 is disposed on the first and second support members SM1 and SM2 and the joint part JP.

According to some embodiments, the first support member SM1 includes a first bottom portion BP1, which is parallel to the first and second directions DR1 and DR2, and a first guide portion GD1, which protrudes upward from all sides of the first bottom portion BP1 except for a side adjacent to the joint part JP. The second support member SM2 includes a second bottom portion BP2, which is parallel to the first and second directions DR1 and DR2, and a second guide portion GD2, which protrudes upward from all sides of the second bottom portion BP2 except for a side adjacent to the joint part JP. The sides of the first bottom portion BP1 and the side of the second bottom portion BP2 that are adjacent to the joint part JP face each other.

According to some embodiments, the joint part JP includes a first joint unit JP1 and a plurality of second joint units JP2, which are spaced apart from each other with the first joint unit JP1 interposed therebetween. The number of the second joint units JP2 disposed between the first joint unit JP1 and the first support member SM1 is equal to the number of the second joint units JP2 disposed between the first joint unit JP1 and the second support member SM2, but embodiments of the inventive concept are not limited thereto.

According to some embodiments, the first joint unit JP1 includes a first extended portion EXP1, which extends in the second direction DR2, and first sidewall portions SW1, which extend upward from both ends of the first extended portion EXP1. Each of the second joint units JP2 includes a second extended portion EXP2, which extends in the second direction DR2, and second sidewall portions SW2, which extend upward from both ends of the second extended portion EXP2. The second sidewall portion SW2 have a reversed trapezoidal shape, when viewed from the second direction DR2, wherein a reversed trapezoidal shape has a bottom side that is parallel to a top side but is shorter than the top side.

According to some embodiments, the first and second sidewall portions SW1 and SW2 extend in the first direction DR1 to connect with the first and second guide portions GD1 and GD2 extending in the first direction DR1. The display module 100 disposed on the first and second bottom portions BP1 and BP2 and the first and second extended portions EXP1 and EXP2.

According to some embodiments, referring to FIGS. 6 and 7, recesses G that extend in the second direction DR2 are defined along edges between side and top surfaces SS and TS of the second joint unit JP2. For example, the second extended portion EXP2 includes a first portion PT1 which extends in the second direction DR2 and has a reverse trapezoidal cross-sectional shape when viewed from the second direction DR2, and a second portion PT2, which extends upward from a top surface of the first portion PT1 and has a rectangular or tetragonal cross-sectional shape. When measured in the first direction DR1, a first width W1 of the second portion PT2 is less than a second width W2 of the top surface of the first portion PT1.

According to some embodiments, each of the recesses G is defined by a corresponding side surface of the second portion PT2 and the top surface of the first portion PT1. Thus, the recesses G are defined along the edges between the side surfaces SS of the second extended portion EXP2 and the top surface TS of the second extended portion EXP2.

According to some embodiments, referring to FIGS. 5 and 8, the third and fourth support members SM3 and SM4 are arranged along the first direction DR1 and have shapes that are symmetric to each other. The hinge member provides a rotation axis to each of the facing sides of the third and fourth support members SM3 and SM4. This will be described in more detail below.

According to some embodiments, the third support member SM3 includes a plurality of first protruding portions P1 that protrude from a side of the third support member SM3 that faces the fourth support member SM4, and fourth support member SM4 includes a plurality of second protruding portions P2 that protrude from a side that faces the third support member SM3. Although FIGS. 5 and 8 shows two first protruding portions P1 and two second protruding portions P2, embodiments are not limited thereto and the number of first and second protruding portions P1 and P2 can differ from two.

According to some embodiments, the first protruding portions P1 are spaced apart from each other in the second direction DR2, and the second protruding portions P2 are spaced apart from each other in the second direction DR2. Each of the first and second protruding portions P1 and P2 has a cylindrical structure extending in the second direction DR2.

According to some embodiments, a first recess G1 is defined in a predetermined region of a top surface of the third support member SM3, e.g., adjacent to a center portion of a side of the third support member SM3 that faces the fourth support member SM4. The first recess G1 is positioned between the first protruding portions P1 and adjacent to a side that faces the fourth support member SM4.

According to some embodiments, a second recess G2 is defined in a predetermined region of a top surface of the fourth support member SM4, e.g., adjacent to a center portion of a side of the fourth support member SM4 that faces the third support member SM3. The second recess G2 is positioned between the second protruding portions P2 and adjacent to a side that faces the third support member SM3.

According to some embodiments, the hinge member HGM includes a plurality of first connection portions CP1, which are connected to the bottom of the first joint unit JP1 and are arranged along the second direction DR2, and a plurality of second connection portions CP2 disposed below the first joint unit JP1 and between the first connection portions CP1.

According to some embodiments, the first connection portions CP1 have a double cylindrical structure that extends in the second direction DR2. The double cylindrical structure includes two cylindrical patterns that extend parallel to the second direction DR2, are adjacent to each other in the first direction DR1, and are connected to each other. Although FIGS. 5 and 8 show two first connection portions CP1, embodiments are not limited thereto and the number of the first connection portions CP1 may differ from two.

According to some embodiments, the second connection portions CP2 are arranged along the first direction DR1 and are positioned between the first connection portions CP1. Although FIGS. 5 and 8 show two second connection portions CP2, embodiments are not limited thereto and the number of the second connection portions CP2 may differ from two. The first and second connection portions CP1 and CP2 are placed between the first protruding portions P1 and the second protruding portions P2.

According to some embodiments, each of the first and second protruding portions P1 and P2 includes a first hole H1 in a center thereof that extends in the second direction DR2. Each of the first connection portions CP1 includes a plurality of second holes H2 that extend in the second direction DR2. For example, each of the first connection portions CP1 has two second holes H2 that extend parallel to each other. Each of the second connection portions CP2 includes a third hole H3 that extends in the second direction DR2.

According to some embodiments, the first holes H1, the second holes H2, and the third holes H3 connect with each other. For example, one of the second holes H2 in each of the first connection portions CP1 connects with the first holes H1 defined in the first protruding portions P1, and the other second hole connects with the first holes H1 defined in the second protruding portions P2. One of the third holes H3 of the second connection portions CP2 connects with one of the second holes H2 defined in the first connection portions CP1, and the other third hole H3 connects with the other second hole 142 of the first connection portions CP1.

According to some embodiments, the hinge pin units HPU can be inserted into the first holes H1, the second holes H2, and the third holes H3, and the coupling units CU are connected to respective ends of the hinge pin units HPU. Due to the hinge pin units HPU, the first rotation axis RX1 and the second rotation axis RX2 are respectively provided along a side of the third support member SM3 and along a side of the fourth support member SM4. For example, the third support member SM3 and the fourth support member SM4 pivot about the hinge pin units HPU.

According to some embodiments, each of the second connection portions CP2 includes a body part BP, which extends in the second direction DR2 and has a shape of two parallel cylinders, and a sub-connection part SC, which extends outward in the first direction DR1 from an outer curved surface of the body part BP on each side of the body part BP. The third hole H3 is defined in each of the parallel cylinders of the body part BP. One of the sub-connection parts SC is placed in the first recess G1, and the other is placed in the second recess G2.

According to some embodiments, the sub-connection parts SC are respectively connected to bottom surfaces of the first and second support members SM1 and SM2. For example, one of the sub-connection parts SC is connected to a portion of the bottom surface of the first support member SM1 adjacent to the second support member SM2, and the other is connected to a portion of the bottom surface of the second support member SM2 adjacent to the first support member SM1.

According to some embodiments, a plurality of sliding holes SH are provided in the third and fourth support members SM3 and SM4. The sliding holes SH extend in the first direction DR1. The sliding units SU overlap the sliding holes SH in one-to-one correspondence.

According to some embodiments, the sliding units SU are connected to the bottom surfaces of the first and second support members SM1 and SM2 through the sliding holes SH. Each of the sliding units SU includes an insertion part IP, which extends in the first direction DR1 and is inserted into a corresponding sliding hole SH, and a supporting part SP, which is connected to a bottom surface of the insertion part IP. The insertion parts IP are inserted into the sliding holes SH and are be connected to the bottom surfaces of the first and second support members SM1 and SM2.

According to some embodiments, lower protruding portions LP are disposed on the bottom surfaces of the first and second support members SM1 and SM2, respectively. The lower protruding portions LP protrude downward from the bottom surfaces of the first and second support members SM1 and SM2. The insertion parts IP are connected to the lower protruding portions LP in one-to-one correspondence.

According to some embodiments, a plurality of connection holes CH are provided in each of the sliding units SU, and a plurality of connection recesses CG are provided in each of the lower protruding portions LP. The insertion parts IP and the lower protruding portions LP are inserted into the sliding holes SH, and the connection holes CH connect with the connection recesses CG in one-to-one correspondence.

According to some embodiments, a plurality of pin units PU are inserted into the connection holes CH and the connection recesses CG to connect the insertion parts IP to the lower protruding portions LP. As a result, the sliding units SU can be connected to the bottom surfaces of the first and second support members SM1 and SM2.

According to some embodiments, although eight sliding units SU, eight lower protruding portions LP, and eight sliding holes SH are illustrated in FIGS. 5 and 8, embodiments are not limited thereto, the numbers of the sliding units SU, the lower protruding portions LP, and the sliding holes SH may vary in other embodiments.

Figure 9:
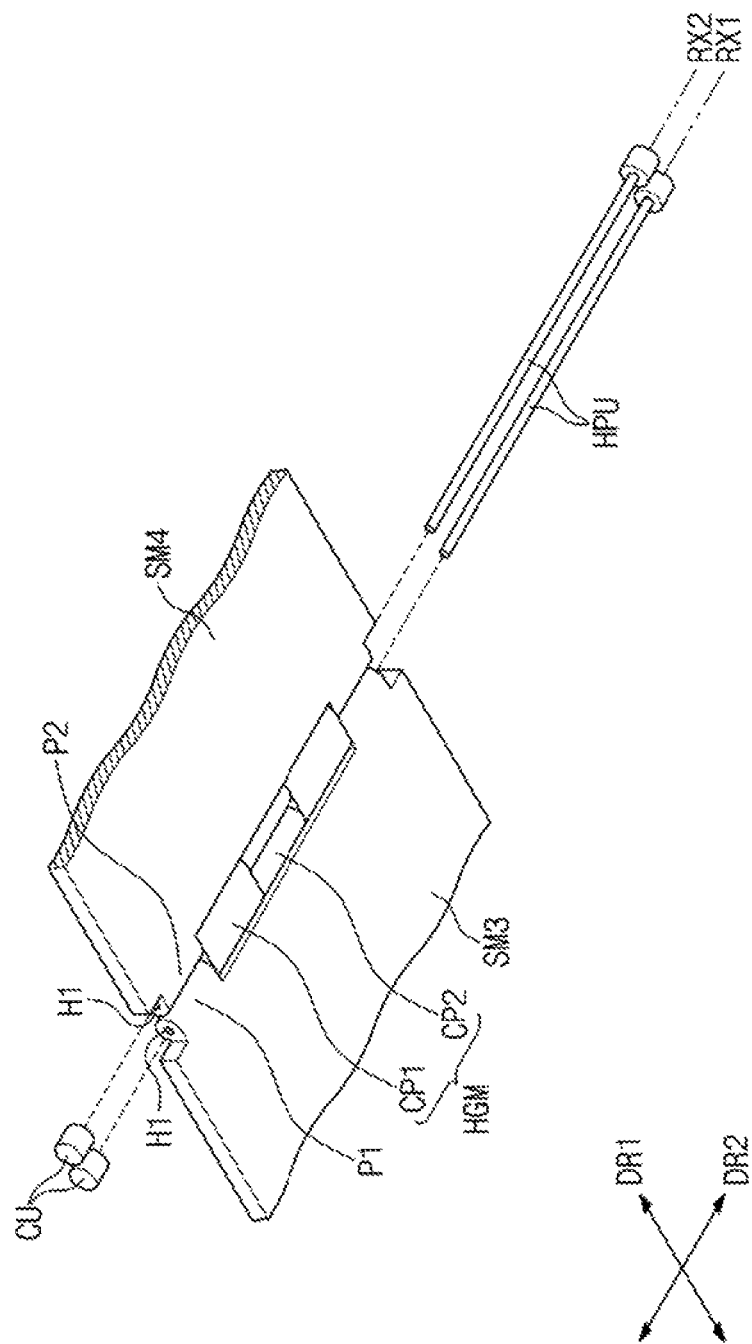
FIG. 9 illustrates how a hinge member is connected to third and fourth support members.

FIG. 9 illustrates how a hinge member is connected to third and fourth support members.

For convenience in illustration, bottom surfaces of the third and fourth support members SM3 and SM4 are illustrated in FIG. 9.

According to some embodiments, referring to FIG. 9, as described above, the first and second connection portions CP1 and CP2 are placed between the first protruding portions P1 and between the second protruding portions P2, and the first holes H1, the second holes H2, and the third holes H3 connect with each other. The hinge pin units HPU are inserted into the first holes H1, the second holes H2, and the third holes H3, and the coupling units CU are connected to respective ends of the hinge pin units HPU.

According to some embodiments, the hinge member HGM may be connected to the side of the third support member SM3 and to the side of the fourth support member SM4, and the third support member SM3 and the fourth support member SM4 can pivot about the hinge pin units HPU.

Figure 10:
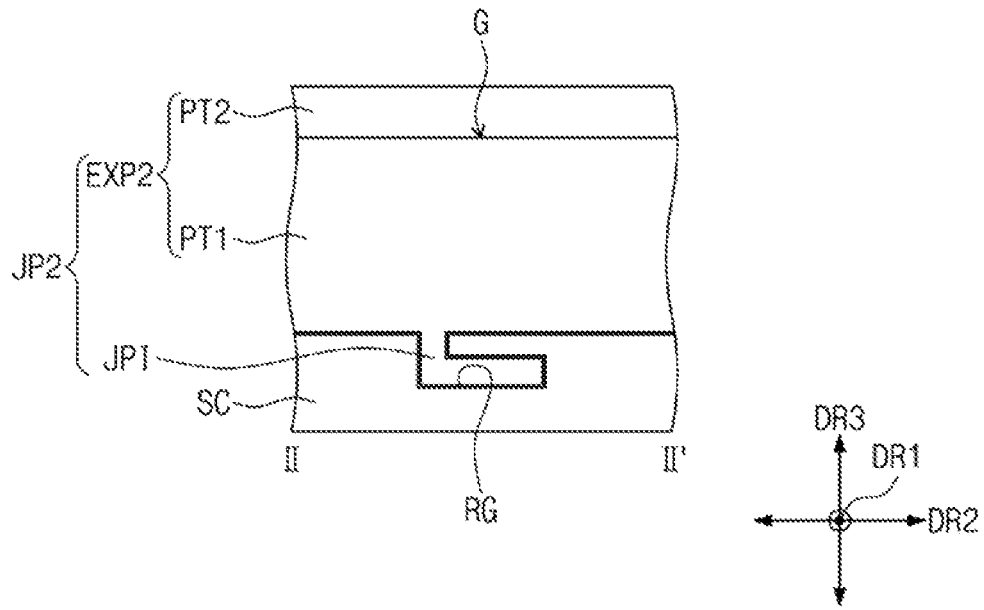
FIG. 10 is a sectional view taken along line of FIG. 8.
Figure 11:
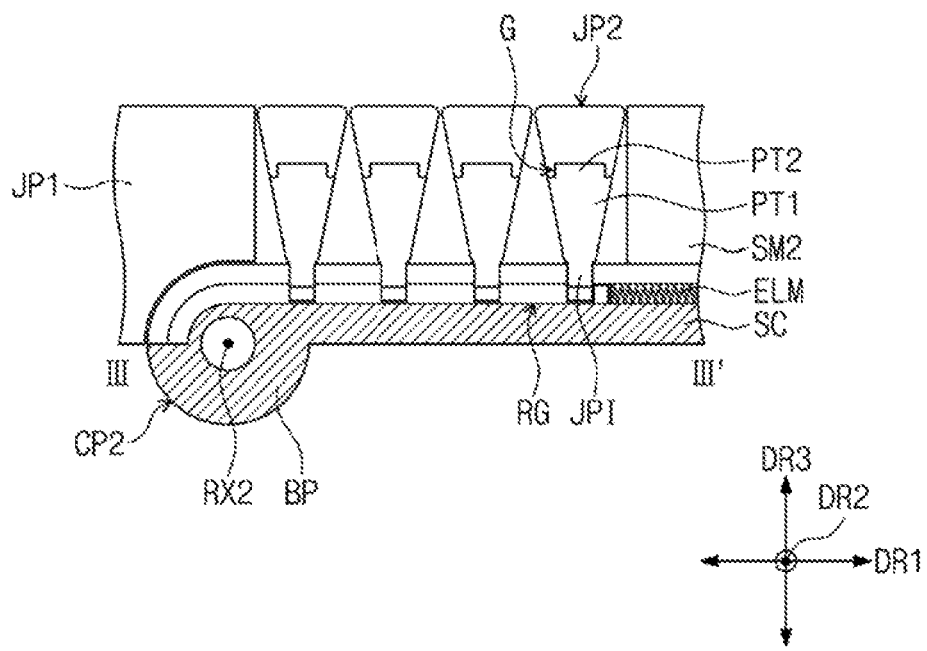
FIG. 11 is a sectional view taken along line III-III' of FIG. 8.

FIG. 10 is a sectional view taken along line II-II' of FIG. 8. FIG. 11 is a sectional view taken along line III-III' of FIG. 8.

FIGS. 10 and 11 illustrate a connection structure between the second joint units SP2 and the second connection portions CP2. FIG. 10 illustrates sections of the second joint unit JP2 and the sub-connection part SC as viewed from the first direction DR1, and FIG. 11 illustrates sections of the second joint units JP2 and the second connection portion CP2, which are located at a right side of the first joint unit JP1, when viewed from the second direction DR2.

According to some embodiments, referring to FIG. 10, the second joint unit JP2 includes a joint insertion part JP1, which protrudes downward from a center portion of a bottom surface of the second extended portion EXP2 and is shaped like a letter "L" when viewed from the first direction DR1. Other second joint units JP2 also have the same shape as the second joint unit JP2 shown in FIG. 10. A rail groove RG is provided in a top surface of the second connection portion CP2, and when viewed from the first direction DR1, the rail groove RG has the same cross-sectional shape, i.e., an "L" shape, as the joint insertion part JP1.

According to some embodiments, referring to FIG. 11, the rail groove RG extends in the first direction DR1 from a predetermined position in the top surface of the sub-connection part SC to a predetermined position on an outer circumference surface of the body part BP. The second joint units JP2 and the second connection portion CP2, which are located at a left side of the first joint unit JP1, have substantially the same structure as the second joint units JP2 and the second connection portion CP2 shown in FIG. 11.

According to some embodiments, the second connection portion CP2 includes elastic members ELM disposed in a portion of the rail groove RG near the joint insertion part JP1 of the second joint units JP2 adjacent to the first support member SM1 and the second support member SM2. When the second support member SM2 is rotated about the second rotation axis RX2, the elastic member ELM pushes the second joint units JP2 toward a center portion of the support member 200, and thus, the second joint units JP2 are moved along the rail groove RG.

In addition, an elastic member may be disposed in a rail groove of the second connection portion CP2 on a left side of the first joint unit W1. In some embodiments, such an elastic member may be positioned near the joint insertion part JP1 of the second joint unit JP2 adjacent to the first support member SM1.

Figure 12:
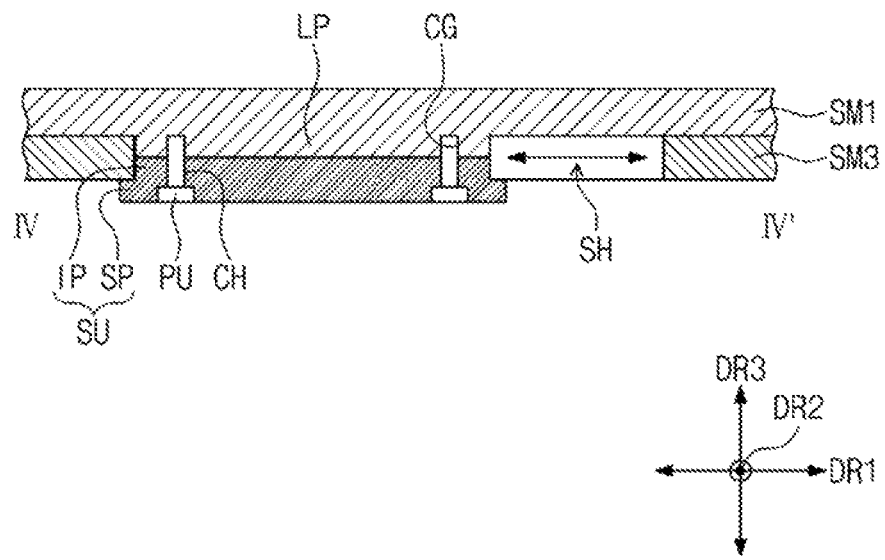
FIG. 12 is a sectional view taken along line IV-IV of FIG. 8.
Figure 13:
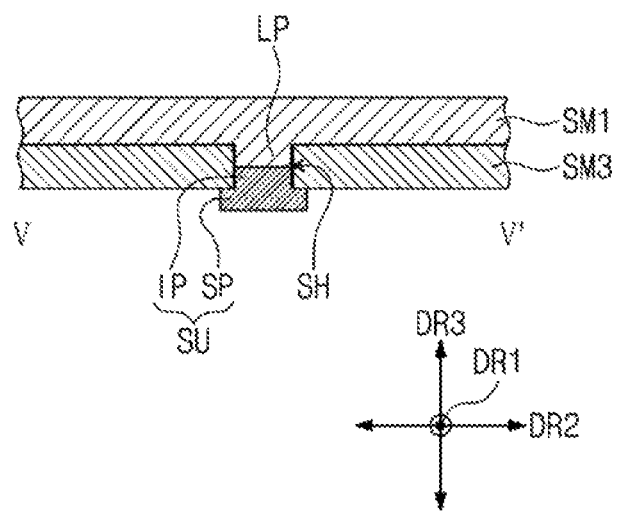
FIG. 13 is a sectional view taken along line V-V' of FIG. 8.

FIG. 12 is a sectional view taken along line IV-IV' of FIG. 8. FIG. 13 is a sectional view taken along line V-V' of FIG. 8.

According to some embodiments, referring to FIGS. 12 and 13, the insertion part IP and the lower protruding portion LP are inserted into the sliding hole SH, and the pin units PU are inserted into the connection holes CH and the connection recesses CG to connect the insertion part IP to the lower protruding portion LP.

According to some embodiments, when viewed from the third direction DR3, a size of the supporting part SP is larger than that of the insertion part IP. A width of the supporting part SP in the second direction DR2 is greater than a width of the sliding hole SH in the second direction DR2, and thus, a portion of the supporting part SP is not inserted into the sliding hole SH and is in contact with a bottom surface of the third support member SM3 adjacent to the sliding hole SH.

According to some embodiments, the lower protruding portion LP and the insertion part LP are the same size, and when measured in the first direction DR1, lengths of the lower protruding portion LP and the insertion part IP are less than that of the sliding hole SH. Where the insertion part IP is connected to the lower protruding portion LP, the insertion part IP and the lower protruding portion LP can move in the sliding hole SH along the first direction DR1.

According to some embodiments, the first support member SM1 can slide back-and-forth along the sliding hole SH along the first direction DR1. Accordingly, the third support member SM3 is connected to the bottom surface of the first support member SM1 by the sliding unit SU and can slide on the bottom surface of the first support member SM1.

Although FIGS. 12 and 13 show a connection structure between one lower protruding portion LP and one sliding unit SU, other lower protruding portions LP can be connected to other sliding units SU in the same manner. That is, the third and fourth support members SM3 and SM4 can be connected to the bottom surfaces of the first and second support members SM1 and SM2 by the sliding units SU and can slide along the bottom surfaces of the first and second support members SM1 and SM2.

Figure 14:
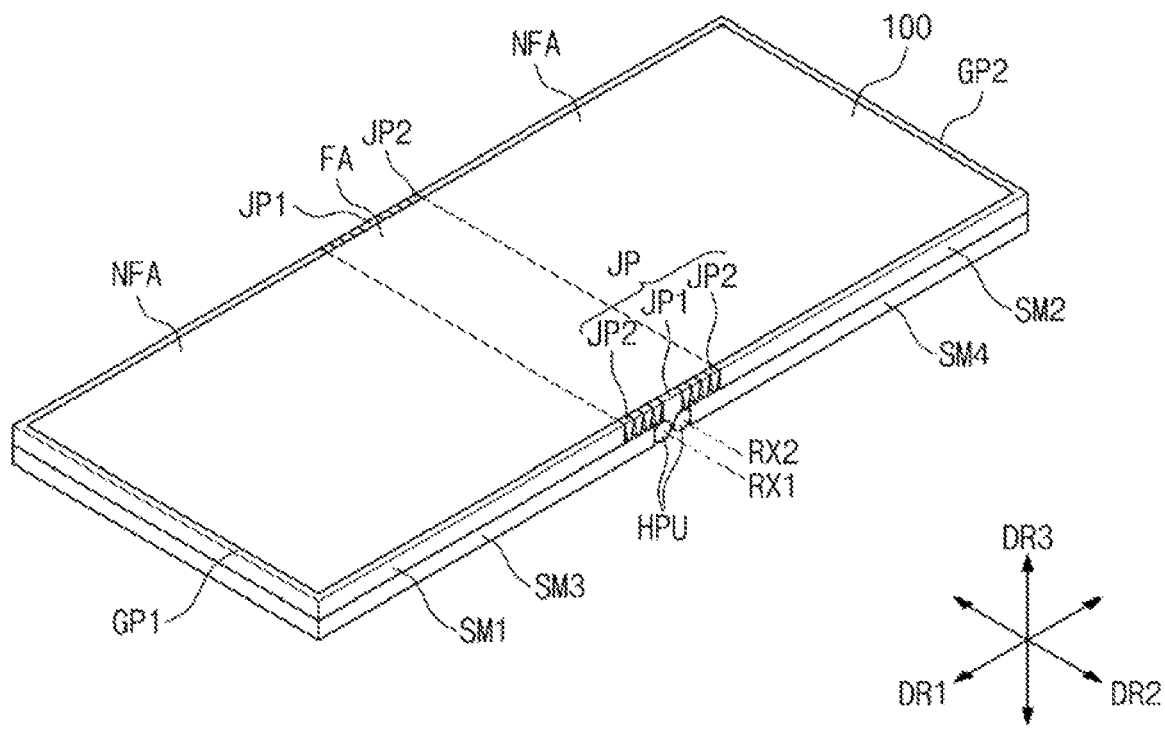
FIG. 14 is a perspective view of a display device according to some embodiments of the inventive concept, in which first and second support members, joint units, a hinge member, and third and fourth support members are assembled.
Figure 15:
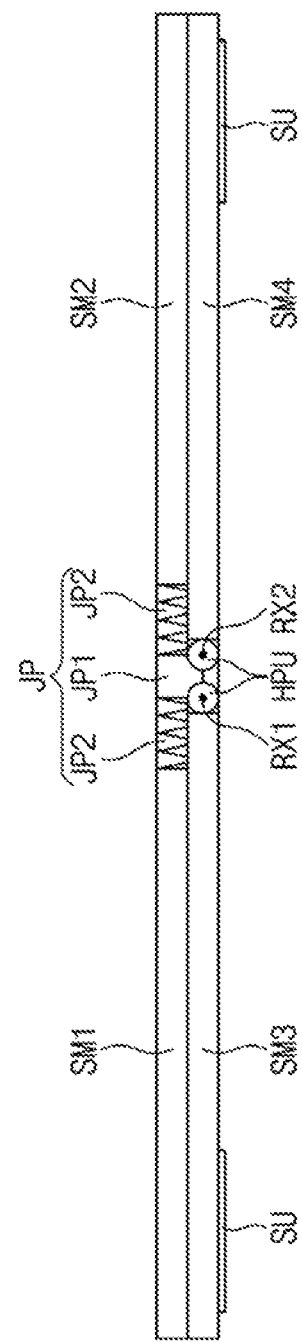
FIG. 15 is a side view of a display device of FIG. 14 viewed from a second direction.
Figure 16:
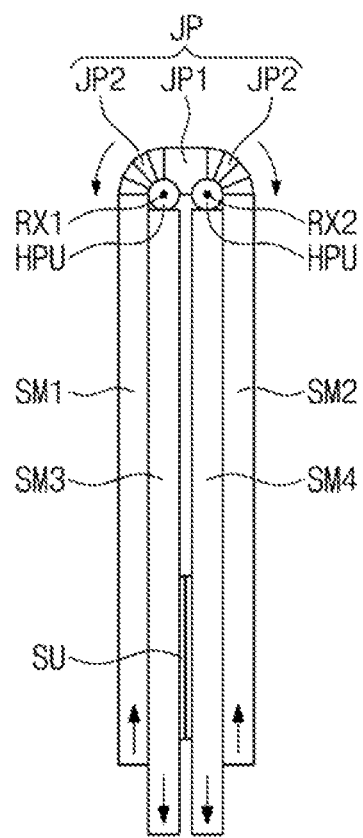
FIG. 16 illustrates a folded structure of a display device of FIG. 15.

FIG. 14 is a perspective view of a display device according to some embodiments of the inventive concept, in which first and second support members, joint units, a hinge member, and third and fourth support members are assembled. FIG. 15 is a side view of a display device of FIG. 14 as viewed from a second direction. FIG. 16 illustrates a folded structure of a display device of FIG. 15.

According to some embodiments, referring to FIGS. 14, 15, and 16, the non-folding regions NFA of the display module 100 are provided on the first and second bottom portions BP1 and BP2, respectively, and the folding region FA is provided on the first and second extended portions EXP1 and EXP2. The display module 100 is attached to the first and second bottom portions BP1 and BP2 and the first and second extended portions EXP1 and EXP2 by an adhesive member. The side surfaces of the display module 100 are adjacent to inner side surfaces of the first and second guide portions GD1 and GD2 and inner side surfaces of the first and second sidewall portions SW1 and SW2.

According to some embodiments, the third and fourth support members SM3 and SM4 rotate about the first and second rotation axes RX1 and RX2 when the display device 1000 is folded. In addition, the first rotation axis RX1 and the second rotation axis RX2 are respectively disposed adjacent to and along the side of the first support member SM1 and the side of the second support member SM2, and the first support member SM1 and the second support member SM2 can rotate about the first rotation axis RX1 and the second rotation axis RX2, respectively.

According to some embodiments, when the display device 1000 is folded, the side surfaces of the first and second joint units JP1 and JP2 come into contact with each other. In some embodiments, when the display device 1000 is folded out, the display surface DS of the display module 100 is externally exposed.

According to some embodiments, when the display device 1000 is folded out, the first and second support members SM1 and SM2 and the third and fourth support members SM3 and SM4 are moved in a sliding manner and in opposite directions by the sliding units SU. For example, the first and second support members SM1 and SM2 are moved toward a center portion of the display device 1000 relative to the third and fourth support members SM3 and SM4, and the third and fourth support members SM3 and SM4 are moved in a direction opposite to that of the first and second support members SM1 and SM2.

Figure 17:
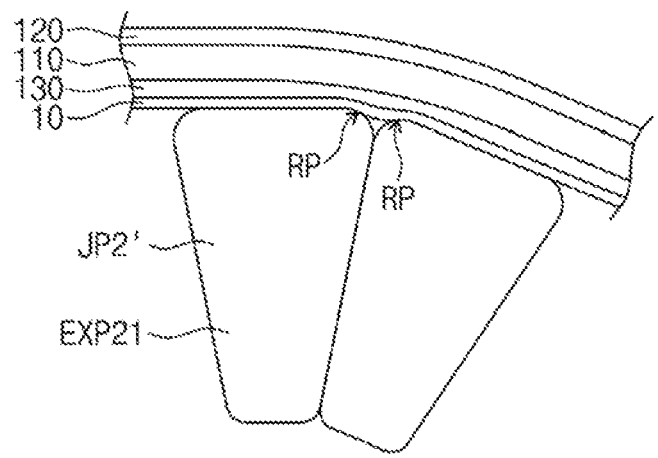
FIGS. 17 and 18 illustrate configurations of comparative joint units, when a comparative display device is unfolded from a folded state.
Figure 18:
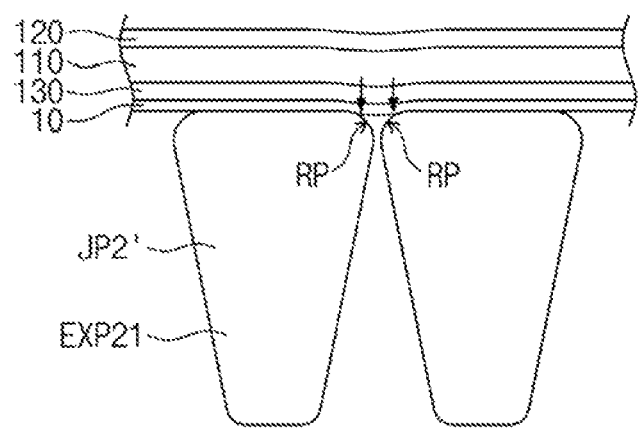

FIGS. 17 and 18 illustrate configurations of comparative joint units, when a comparative display device is unfolded from a folded state.

According to some embodiments, referring to FIGS. 17 and 18, comparative joint units JP2' are arranged at substantially the same positions as the second joint units JP2. The comparative joint units JP2' have second comparative extended portions EXP2' but without the recesses G of the second joint units JP2. Each of the second comparative extended portions EXP2' has a reverse trapezoidal cross-sectional shape, and a top portion thereof has rounded portions RP at left and right corners.

When a comparative display device with a comparative joint units JP2' is folded, the adhesive member 10, which attaches the display module 100 to the second comparative extended portions EXP2', becomes attached to at least one of the rounded portions RP. When a folded comparative display device is unfolded, the adhesive member 10, which is attached to at least one of the rounded portions RP, exerts a downward force on a portion of the display module 1000. That is, the display module 1000 can be unintentionally pulled downward, which can deform the folding region FA. The adhesive member 10 should be in contact with only the top surface of the second comparative extended portions EXP2', but in practice, the adhesive member 10 can unintentionally attach to the rounded portion RP when a display device is folded, thereby causing the above effect.

Figure 19:
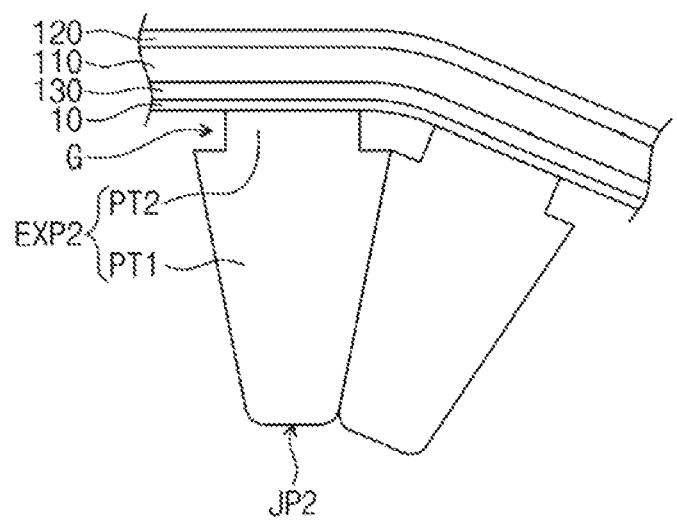
FIGS. 19 and 20 illustrate configurations of adjacent second joint units, when a display device according to some embodiments of the inventive concept is unfolded from a folded state.
Figure 20:
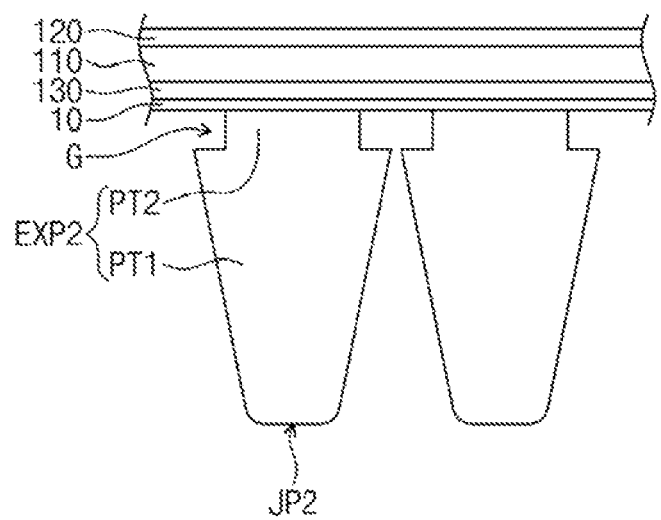

FIGS. 19 and 20 illustrate configurations of adjacent second joint units, when a display device according to some embodiments of the inventive concept is unfolded from a folded state.

According to some embodiments, referring to FIGS. 19 and 20, the display module 100 is attached by the adhesive member 10 to top surfaces of the second portions PT2 of the second extended portions EXP2 of the second joint units JP2. A state of the adhesive member 10 attached to the second portions PT2 is maintained when the display device 1000 is folded.

In some embodiments, the second joint units JP2 are provided to define the recesses G without the rounded portions RP, which can prevent the adhesive member 10 from unintentionally becoming attached to a portion of the second joint units JP2, such as the rounded portions RP of the comparative joint units JP2'. For example, the adhesive member 10 is attached to desired portions of the second portions PT2 and is prevented from becoming attached to other portions of the second joint units JP2.

According to some embodiments, since the adhesive member 10 is attached only to the top surfaces of the second portions PT2, it is possible to prevent a portion of the display module 100 located between the second joint units JP2 from being pulled downward when the display device 1000 is folded and then unfolded. As a result, the folding region FA of the display module 100 can be prevented from becoming unintentionally deformed.

Figure 21:
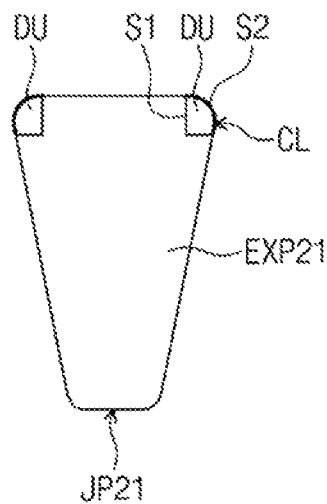
FIGS. 21 and 22 illustrate a structure of a second joint unit according to other embodiments of the inventive concept.
Figure 22:
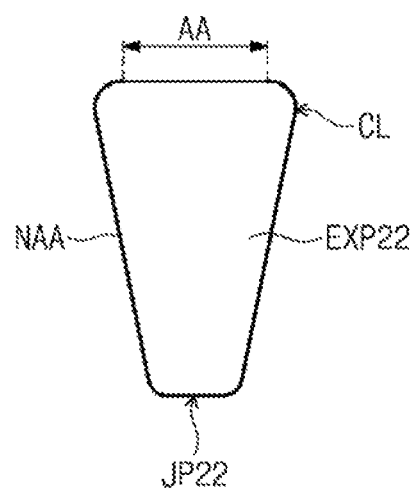

FIGS. 21 and 22 illustrate a structure of a second joint unit according to other embodiments of the inventive concept.

For convenience in illustration, a second extended portion of one second joint unit is illustrated in FIGS. 21 and 22. Except for technical features associated with second extended portions EXP21 and EXP22 of second joint units JP21 and JP22, the second joint units JP21 and JP22 have the same shape as the second joint unit JP2 shown in FIGS. 6 and 7. Thus, technical features of the second joint units JP21 and JP22, which differ from the second joint unit JP2 of FIGS. 6 and 7, will be described below.

According to some embodiments, referring to FIG. 21, dummy units DU are disposed in the recesses G of the second extended portion EXP21 of the second joint unit JP21. Each of the dummy units DU includes a first surface S1 in contact with the recesses G, and a second surface S2 opposite to the first surface S1. The second surface S2 of each of the dummy units DU has a convex curved shape, and a top surface, a bottom surface, and side surfaces of the second extended portion EXP21 and the second surfaces S2 of the dummy units DU are connected to each other, thereby forming a reverse trapezoidal cross-sectional shape. The second surfaces S2 connect the top surface of the reverse trapezoidal shape to the side surfaces of the reverse trapezoidal shape and form curved corner portions.

According to some embodiments, a coating layer CL for adhesion prevention is disposed on the second surface S2 of each of the dummy units DU. For example, the coating layer CL can be a fluorine coating layer or an anti-fingerprint (AF) coating layer. The adhesive member 10 is attached to the top surface of the second extended portion EXP2 but is prevented from attaching to the second surface S2 of each of the dummy units DU by the coating layer CL. Thus, even when the display device 1000 is folded and unfolded, the folding region FA of the display module 100 can be prevented from being deformed.

According to some embodiments, referring to FIG. 22, the second extended portion EXP22 of the second joint unit JP22 has a reverse trapezoidal cross-sectional shape, and corners of the second extended portion EXP22 where the top and side surfaces meet have a convex curved shape. The second extended portion EXP22 of the second joint unit JP22 has substantially the same shape as a structure formed by the dummy units DU and the second extended portion EXP21 shown in FIG. 21.

According to some embodiments, a top surface of the second extended portion EXP22 is an adhesion area AA, and other surfaces of the second extended portion EXP22 are non-adhesion areas NAA. The adhesive member 10 that attaches the display module 100 to the second extended portion EXP22 is disposed on the adhesion area AA, and the coating layer CL for adhesion prevention is disposed on the non-adhesion area NAA. Thus, even when the display device 1000 is folded and unfolded, the adhesive member 10 does not attach to the non-adhesion area NAA, and the folding region FA of the display module 100 can be prevented from being deformed.

Figure 23:
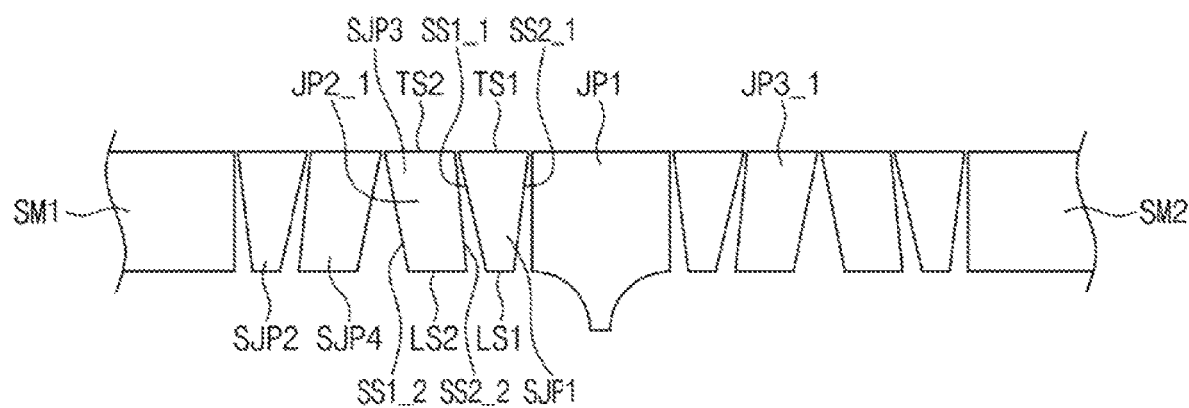
FIG. 23 illustrates a structure of a joint part of a display device according to other embodiments of the inventive concept.

FIG. 23 illustrates a structure of a joint part of a display device according to other embodiments of the inventive concept.

Except for technical features associated with second and third joint units JP2_1 and JP3_1 of the joint part JP, a support member of a display device according to other embodiments of the inventive concept has substantially the same structure as the support member 200 of the display device 1000 shown in FIGS. 5 and 8. Thus, technical features associated with the joint units JP2_J and JP3_1 of FIG. 23 will be described below. For convenience in illustration, only the joint part JP and the first and second support members SM1 and SM2 are illustrated in FIG. 23, and the same element as those in previous embodiments will be identified using the same reference number.

According to some embodiments, referring to FIG. 23, the joint part JP includes a first joint unit JP1, a plurality of second joint units JP2_1 disposed between the first joint unit JP1 and the first support member SM1, and a plurality of third joint units JP3_1 provided between the first joint unit JP1 and the second support member SM2.

According to some embodiments, the first, second, and third joint units JP1, JP2_1, and JP3_1 are arranged along the first direction DR1 and extend in the second direction DR2. Each of the third joint units JP3_1 has a shape that is symmetric with respect to a corresponding second joint unit JP2_1. Accordingly, the second joint units JP2_1 will be described in more detail below, but the description of the third joint units JP3_1 will be omitted.

According to some embodiments, when viewed from the second direction DR2, the second joint units JP2_1 have a trapezoidal shape. Each of the second joint units JP2_1 includes a top surface, which is parallel to the first and second directions DR1 and a bottom surface, which is parallel and opposite to the top surface, and side surfaces, which connect both sides of the top surface to both sides of the bottom surface when viewed from the second direction DR2.

According to some embodiments, when measured in the first direction DR1, a length of the top surface of each of the second joint units JP2_1 is longer than that of the bottom surface of each of the second joint units JP2_1. The side surfaces of each of the second joint units JP2_1 extend asymmetrically with respect to each other. Thus, each of the second joint units JP2_1 has an asymmetric shape, when viewed from the second direction DR2.

According to some embodiments, the second joint units JP2_1 include a first sub-joint unit SJP1 adjacent to the first joint unit JP1, a second sub-joint unit SJP2 adjacent to the first support member SM1, and third and fourth sub-joint units SJP3 and SJP4 disposed between the first sub-joint unit SJP1 and the second sub joint unit SJP2.

According to some embodiments, the third sub-joint unit SJP3 is adjacent to the first sub-joint unit SJP1, and the fourth sub-joint unit SJP4 is adjacent to the second sub-joint unit SJP2. The second sub-joint unit SJP2 has a shape that is symmetric with respect to the first sub-joint unit SJP1, and the fourth sub-joint unit SJP4 has a shape that is symmetric with respect to the third sub-joint unit SJP3. Thus, the first and third sub-joint units SJP1 and SJP3 will be described in detail, but description of the second and fourth sub-joint units SJP2 and SJP4 will be omitted.

According to some embodiments, when measured in the first direction DR1, a length of a first top surface TS1 of the first sub-joint unit SJP1 is longer than that of a first bottom surface LS1 of the first sub-joint unit SJP1. When viewed from the third direction DR3, the first bottom surface LS1 appears within and surrounded by the first top surface TS1. When viewed from the second direction DR2, the first sub-joint unit SJP1 includes a first side surface SS1_1, which connects a side of the first top surface TS1 to a side of the first bottom surface LS1, and a second side surface SS2_1, which connects an opposite side of the first top surface TS1 to an opposite side of the first bottom surface LS1 and is asymmetric with respect to the first side surface SS1_1.

According to some embodiments, when measured in the first direction DR1, a length of a second top surface TS2 of the third sub-joint unit SJP3 is longer than that of a second bottom surface LS2 of the third sub-joint unit SJP3. When viewed from the second direction DR2, the third sub joint unit SJP3 includes a first side surface SS1_2, which connects a side of the second top surface TS2 to a side of the second bottom surface LS2, and a second side surface SS2_2, which connects an opposite side of the second top surface TS2 to an opposite side of the second bottom surface LS2 and is asymmetric with respect to the first side surface SS1_2.

According to some embodiments, when viewed from the third direction DR3, the second bottom surface LS2 appears to partially overlap the second top surface TS2. When measured in the first direction DR1, a length of the second bottom surface LS2 is longer than that of the first bottom surface LS1. The opposite side of the second bottom surface LS2 is closer to the first joint unit JP1 than the opposite side of the second top surface TS2. Due to this structure, a size of each of the third and fourth sub-joint units SJP3 and SJP4 is larger than a size of each of the first and second sub-joint units SJP1 and SJP2, when viewed from the second direction DR2.

According to some embodiments, the display module 100 is attached to the second joint units JP2_1 by the adhesive member 10, and the display device can be folded and unfolded by the hinge member HGM. When the folding/unfolding operation of the display device is repeated, the second joint units JP2_1 can be deformed by an adhesive strength of the adhesive member 10 and a tensile three of the folding region of the display module 100.

According to some embodiments, when the second joint units JP2_1 have a reverse trapezoidal shape, central second joint units, i.e., the third and fourth sub-joint units SJP3 and SJP4, are deformed more than the peripheral second joint units, those second joint units that are adjacent to the first support member SM1 and the first joint unit JP1, i.e., the first and second sub-joint units SJP1 and SJP2. This is because the adhesive strength of the adhesive member 10 and the tensile force of the display module 100 that is exerted on the central second joint units are stronger than those exerted on the peripheral second joint units. When the second joint units are deformed, the folding region FA of the display module 100 can also be deformed by the deformed second joint units.

In some embodiments of the inventive concept, sizes of the third and fourth sub joint units SJP3 and SJP4 located at a center region of the second joint units JP2_1 are larger than those of the first and second sub-joint units SJP1 and SJP2. The larger sizes of the second joint units JP2_1 more effectively suppress the adhesive strength of the adhesive member 10 and the tensile force of the display module 100, which can prevent the third and fourth sub joint units SJP3 and SJP4 from being deformed. Accordingly, it is possible to prevent the folding region FA of the display module 100 from being deformed.

According to some embodiments of the inventive concept, each joint unit is provided with recesses defined by top and side surfaces thereof. Owing to the presence of the recesses, an adhesive member attaches only to top surfaces of the joint units. That is, the adhesive member can be prevented from unintentionally attaching to portions of the joint units and consequently a folding region of a display module can be prevented from being deformed by an unintended attachment of the adhesive member.

While exemplary embodiments of the inventive concepts have been particularly shown and described, it will be understood by one of ordinary skill in the art that variations in form and detail may be made therein without departing from the spirit and scope of the attached claims.

What is claimed is:

1. A display device, comprising:
a first support member and a second support member arranged along a first direction;
a joint part disposed between the first and second support members;
a hinge member adjacent to facing sides of the first and second support members and that extends in a second direction crossing the first direction, wherein the hinge member is connected to a bottom surface of the joint part and bottom surfaces of the first and second support members and includes two rotation axes that extend in a second direction that crosses the first direction; and
a flexible display module disposed on the first and second support members and the joint part,
wherein the joint part comprises:
a first joint unit that extends in the second direction; and
a plurality of second joint units arranged along the first direction and that extend in the second direction, wherein the first joint unit is disposed between the plurality of second joint units, and
each of the second joint units includes recesses between side and top surfaces thereof and that extend in the second direction,
the recesses are formed at both ends of an upper portion of the each of the second joint units, and the both ends are opposite to each other in the first direction.

2. The display device of claim 1, wherein the first joint unit comprises:
a first extended portion that extends in the second direction; and
first sidewall portions that extend upward from both ends of the first extended portion.

3. The display device of claim 2, wherein each of the second joint units comprises:
a second extended portion that extend in the second direction; and
second sidewall portions that extend upward from both ends of the second extended portion,
wherein the recesses are defined along edges between side and top surfaces of the second extended portion.

4. The display device of claim 3, wherein the second sidewall portion has a reverse trapezoidal shape, when viewed from the second direction.

5. The display device of claim 3, wherein the second extended portion comprises:
a first portion that extends in the second direction and that has a reverse trapezoidal shape when viewed from the second direction; and
a second portion that extends upward from a top surface of the first portion and that has a rectangular shape, and
wherein a width of the second portion is less than a width of the top surface of the first portion, when measured in the first direction.

6. The display device of claim 3,
wherein the first support member comprises:
a first bottom portion parallel to the first and second directions; and
a first guide portion that protrudes upward from sides of the first bottom portion except for a side adjacent to the joint part,
wherein the second support member comprises:
a second bottom portion parallel to the first and second directions; and
a second guide portion that protrudes upward from sides of the second bottom portion except for a side adjacent to the joint part,
wherein the display module is disposed on the first and second bottom portions and the first and second extended portions, and
a side surface of the display module is adjacent to inner side surfaces of the first and second guide portions and inner side surfaces of the first and second sidewall portions.

7. The display device of claim 6, further comprising an adhesive member that attaches the display module to the first and second bottom portions and the first and second extended portions.

8. The display device of claim 3, wherein each of the second joint units further comprises a joint insertion part that protrudes downward from a center portion of a bottom surface of the second extended portion and has a "L"-shaped section when viewed from the first direction,
wherein the hinge member comprises:
a plurality of first connection portions connected to a bottom surface of the first joint unit and arranged in the second direction; and
a plurality of second connection portions disposed below the first joint unit and between the first connection portions,
wherein the joint insertion parts of the second joint units are inserted into a rail groove provided in top surfaces of the second connection portions.

9. The display device of claim 8, wherein each of the second connection portions comprises:
a body part that extends in the second direction and has shape of two parallel cylinders, each of which rotates about a corresponding one of the two rotation axes;
a sub-connection part that extends outward in the first direction from an outer curved surface of the body part on each side of the body part; and
elastic members disposed in the rail groove adjacent to the joint insertion parts of the second joint units adjacent to the first and second support members, and
wherein the sub-connection parts of the second connection portions are connected to a bottom surface of the first support member and a bottom surface of the second support member, respectively.

10. The display device of claim 9, further comprising:
a third support member disposed below the first support member;
a fourth support member disposed below the second support member;
a plurality of first protruding portions that protrude from a side of the third support member that faces the fourth support member, each of the first protruding portions having a cylindrical structure that extends in the second direction; and
a plurality of second protruding portions that protrude from a side of the fourth support member that faces a side of the third support member, each of the second protruding portions having a cylindrical structure that extends in the second direction, wherein the third and fourth support members are respectively connected to the bottom surfaces of the first and second support members and are configured to slide, and
the first and second connection portions are disposed between the first protruding portions and the second protruding portions.

11. The display device of claim 10, further comprising:
a pair of hinge pin units that extend in the second direction; and
a pair of coupling units that correspond to the hinge pin units,
wherein the hinge pin units are inserted into first holes in the first and second protruding portions and that extend in the second direction, into second holes in the first connection portions and that extend in the second direction, and into third holes in the second connection portions and that extend in the second direction, and
the coupling units are connected to respective ends of the hinge pin units.

12. The display device of claim 3, further comprising a dummy unit inserted into each of the recesses,
wherein the dummy unit comprises:
a first surface in contact with a correspond recess; and
a second surface opposite to the first surface,
wherein the second surface has a convex curved shape, and
the second surface and top, bottom, and side surfaces of the second extended portion are connected to each other to form a reverse trapezoidal shape.

13. The display device of claim 12, further comprising a fluorine coating layer or an AF coating layer disposed on the second surface.

14. The display device of claim 12, further comprising:
an adhesive member that attaches the display module to the top surface of the second extended portion; and
a coating layer that prevents the display module from attaching to other surfaces of the second extended portion.

15. The display device of claim 1, wherein when the display module is folded out to externally expose a display surface of the display module, the first and second support members rotate about the two rotation axes.

* * * * *